United States Patent
Goto et al.

(10) Patent No.: US 12,250,802 B2
(45) Date of Patent: Mar. 11, 2025

(54) DIFFERENTIAL SIGNAL TRANSMISSION CABLE

(71) Applicant: SUMITOMO ELECTRIC INDUSTRIES, LTD., Osaka (JP)

(72) Inventors: Kengo Goto, Osaka (JP); Akihisa Hosoe, Osaka (JP); Yuto Kobayashi, Kanuma (JP); Yuji Ochi, Kanuma (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 25 days.

(21) Appl. No.: 17/792,492

(22) PCT Filed: Jan. 30, 2020

(86) PCT No.: PCT/JP2020/003326
§ 371 (c)(1),
(2) Date: Jul. 13, 2022

(87) PCT Pub. No.: WO2021/152757
PCT Pub. Date: Aug. 5, 2021

(65) Prior Publication Data
US 2023/0056385 A1    Feb. 23, 2023

(51) Int. Cl.
| H01B 7/00 | (2006.01) |
| H01B 3/44 | (2006.01) |
| H01B 11/00 | (2006.01) |
| H01B 13/22 | (2006.01) |
| H05K 9/00 | (2006.01) |

(52) U.S. Cl.
CPC ........... *H05K 9/0098* (2013.01); *H01B 3/441* (2013.01); *H01B 11/002* (2013.01); *H01B 13/222* (2013.01); *H05K 9/0088* (2013.01)

(58) Field of Classification Search
CPC ...................................................... H01B 7/00
See application file for complete search history.

(56) References Cited

U.S. PATENT DOCUMENTS 5,627,226 A  *  5/1997  Lustiger ................... C08K 7/02
                                                       524/99
6,953,888 B2 * 10/2005  Livshitz ............. H01B 11/1895
                                                       174/28

(Continued)

FOREIGN PATENT DOCUMENTS

| JP | 2009-123490 A | 6/2009 |
| JP | 2019-16451 A  | 1/2019 |
| JP | 2019-160414 A | 9/2019 |

OTHER PUBLICATIONS

Paik et al., "Polypropylene nanosphere: particle size and crystal structure" Published Oct. 22, 2009.*

*Primary Examiner* — Chau N Nguyen
(74) *Attorney, Agent, or Firm* — Oliff PLC

(57) ABSTRACT

A differential signal transmission cable includes an insulation layer extending in a longitudinal direction of the differential signal transmission cable, a pair of signal lines extending in the longitudinal direction and buried inside the insulation layer, an intermediate layer covering an outer circumferential surface of the insulation layer, a shield, and catalyst particles. The shield includes an electroless plating layer covering an outer circumferential surface of the intermediate layer. The catalyst particles are dispersed between the intermediate layer and the electroless plating layer.

15 Claims, 12 Drawing Sheets

(56) References Cited

U.S. PATENT DOCUMENTS

| | | | |
|---|---|---|---|
| 2003/0173104 A1* | 9/2003 | Dell'Anna | H01B 3/441 |
| | | | 174/126.1 |
| 2011/0027650 A1* | 2/2011 | Yamamoto | H01M 4/387 |
| | | | 429/218.1 |
| 2014/0090869 A1* | 4/2014 | Kaga | H01B 11/1839 |
| | | | 427/119 |
| 2015/0175479 A1* | 6/2015 | Brown | C09D 7/67 |
| | | | 65/30.1 |
| 2019/0013559 A1 | 1/2019 | Suenaga et al. | |
| 2020/0243226 A1* | 7/2020 | Suenaga | C23C 18/1806 |

* cited by examiner

DIFFERENTIAL SIGNAL TRANSMISSION CABLE

TECHNICAL FIELD

The present disclosure relates to a differential signal transmission cable.

BACKGROUND ART

PTL 1 (Japanese Patent Laying-Open No. 2019-16451) discloses a differential signal transmission cable. The differential signal transmission cable disclosed in PTL 1 includes an insulation layer, a pair of signal lines, and an electroless plating layer. The pair of signal lines are buried inside the insulation layer. The electroless plating layer is formed on the outer circumferential surface of the insulation layer.

CITATION LIST

Patent Literature

PTL 1: Japanese Patent Laying-Open No. 2019-16451

SUMMARY OF INVENTION

A differential signal transmission cable according to the present disclosure includes an insulation layer extending in a longitudinal direction of the differential signal transmission cable, a pair of signal lines extending in the longitudinal direction and buried inside the insulation layer, an intermediate layer covering an outer circumferential surface of the insulation layer, a shield, and catalyst particles. The shield includes an electroless plating layer covering an outer circumferential surface of the intermediate layer. The catalyst particles are dispersed between the intermediate layer and the electroless plating layer.

DETAILED DESCRIPTION

Figure 1:
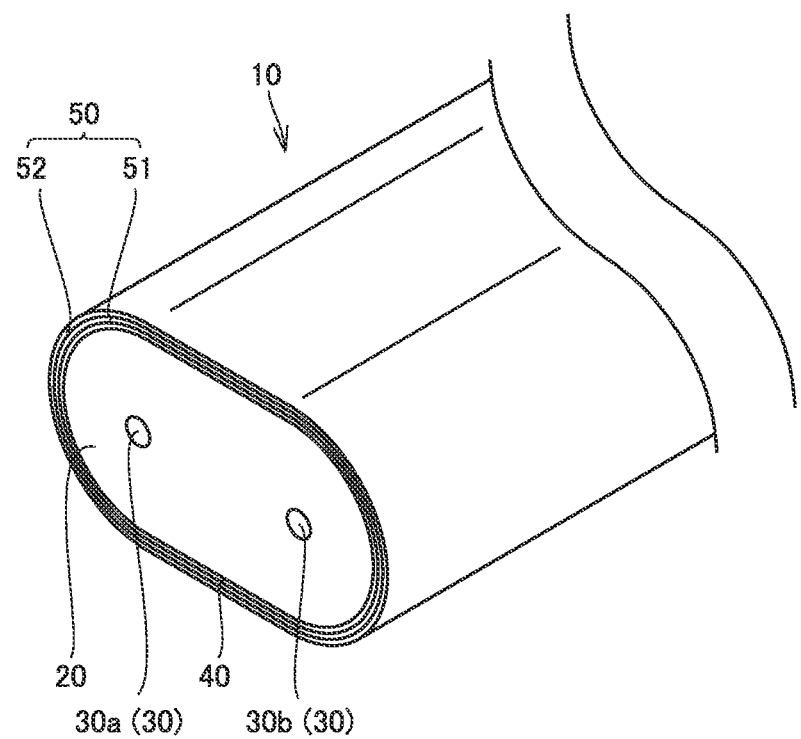
FIG. 1 is a perspective view of a differential signal transmission cable 10.

[Problem to be Solved by the Present Disclosure]

In the differential signal transmission cable disclosed in PTL 1, the outer circumferential surface of the insulation layer is roughened by etching. This yields an anchor effect between the insulation layer and the electroless plating layer, thus achieving adhesion between the insulation layer and the electroless plating layer.

However, the outer circumferential surface of the insulation layer is roughened uniformly by etching, and thus, minute asperities are present periodically in the outer circumferential surface of the etched insulation layer. The periodically present minute asperities may deteriorate attenuation characteristics in a high-frequency region of not less than 30 GHz.

The present disclosure has been made in view of the above problem with the conventional technique. More specifically, the present disclosure provides a differential signal transmission cable that can achieve adhesion of an electroless plating layer without deteriorating attenuation characteristics in a high-frequency region.

[Advantageous Effect of the Present Disclosure]

The differential signal transmission cable according to the present disclosure can achieve adhesion of the electroless plating layer while preventing or reducing deterioration of attenuation characteristics in the high-frequency region.

DESCRIPTION OF EMBODIMENTS

First, embodiments of the present disclosure will be listed and described.

(1) A differential signal transmission cable according to an embodiment includes an insulation layer extending in a longitudinal direction of the differential signal transmission cable, a pair of signal lines extending in the longitudinal direction and buried inside the insulation layer, an intermediate layer covering an outer circumferential surface of the insulation layer, a shield, and catalyst particles. The shield includes an electroless plating layer covering an outer circumferential surface of the intermediate layer. The catalyst particles are dispersed between the intermediate layer and the electroless plating layer.

The differential signal transmission cable according to (1) above can achieve the adhesion of the electroless plating layer while preventing or reducing deterioration of attenuation characteristics in a high-frequency region.

(2) In the differential signal transmission cable according to (1) above, an amount of the catalyst particles contained in the differential signal transmission cable may be not less than 0.1 μg and not greater than 10 μg per centimeter in the longitudinal direction.

The differential signal transmission cable according to (2) above can achieve the adhesion of the electroless plating layer while preventing or reducing deterioration of attenuation characteristics in the high-frequency region.

(3) In the differential signal transmission cable according to (1) or (2) above, an arithmetic average roughness on the outer circumferential surface of the insulation layer may be not greater than 2.0 μm.

The differential signal transmission cable according to (3) above can further prevent or reduce deterioration of attenuation characteristics in the high-frequency region.

(4) In the differential signal transmission cable according to (1) to (3) above, an arithmetic average roughness on the outer circumferential surface of the insulation layer may be less than 0.6 μm.

The differential signal transmission cable according to (4) above can further prevent or reduce deterioration of attenuation characteristics in the high-frequency region.

(5) In the differential signal transmission cable according to (1) to (4) above, a bonding strength between the intermediate layer and the electroless plating layer may be not less than 0.1 N/cm and not greater than 6 N/cm.

The differential signal transmission cable according to (5) above can prevent or reduce peeling-off of the insulation layer together with the intermediate layer in a terminal treatment of the differential signal transmission cable while preventing or reducing peeling-off of the electroless plating layer when a plurality of differential signal transmission cables are stranded into a stranded wire.

(6) In the differential signal transmission cable according to (1) to (5) above, a thickness of the intermediate layer may be not greater than 1 μm.

The differential signal transmission cable according to (6) above can prevent or reduce deterioration of attenuation characteristics in the high-frequency region due to an impedance mismatch between the insulation layer and the electroless plating layer, and the intermediate layer.

(7) In the differential signal transmission cable according to (1) to (6) above, a thickness of the electroless plating layer may be not less than 0.05 μm and not greater than 0.5 μm.

The differential signal transmission cable according to (7) above can prevent or reduce the generation of a region in which the electroless plating layer is not bonded to the outer circumferential surface of the intermediate layer while preventing or reducing the generation of a void at an interface between the electroless plating layer and the intermediate layer due to gas generation during the formation of the electroless plating layer.

(8) In the differential signal transmission cable according to (1) to (7) above, the shield may further include an electroplating layer covering an outer circumferential surface of the electroless plating layer.

The differential signal transmission cable according to (8) above can reduce an electrical resistance value of the shield.

(9) In the differential signal transmission cable according to (8) above, the electroplating layer may be a copper electroplating layer. An average grain size of copper grains of the electroplating layer may be not less than 0.5 μm.

The differential signal transmission cable according to (9) above can prevent or reduce the occurrence of a crack in the electroplating layer when the differential signal transmission cable is bent.

(10) In the differential signal transmission cable according to (8) or (9) above, a sum of a thickness of the electroless plating layer and a thickness of the electroplating layer may be not greater than 6 μm.

The differential signal transmission cable according to (10) above can reduce a manufacturing cost associated with the formation of the shield.

(11) In the differential signal transmission cable according to (1) to (10) above, the catalyst particles may include palladium.

(12) In the differential signal transmission cable according to (1) to (11) above, the insulation layer may include polyolefin having a melting point of not less than 140° C.

(13) In the differential signal transmission cable according to (1) to (11) above, the insulation layer may include at least any of polypropylene, cyclic olefin polymer, and polymethylpentene.

(14) In the differential signal transmission cable according to (1) to (11) above, the insulation layer may include polypropylene grains. The polypropylene grains may have a crystallinity $X_c$ of not less than 0.3, the crystallinity $X_c$ being calculated by an equation (1), $$X_c = \frac{I_c}{I_c + I_a} \qquad (1)$$

where $I_c$ denotes an X-ray diffraction intensity of a crystalline component, and $I_a$ denotes an X-ray diffraction intensity of a non-crystalline component.

The differential signal transmission cable according to (14) above can prevent or reduce a transmission loss of the differential signal transmission cable owing to increased adhesion of the electroless plating layer.

(15) A differential signal transmission cable according to another embodiment includes an insulation layer extending in a longitudinal direction of the differential signal transmission cable, a pair of signal lines extending in the longitudinal direction and buried inside the insulation layer, an intermediate layer covering an outer circumferential surface of the insulation layer, and a shield covering an outer circumferential surface of the intermediate layer. The shield includes an electroless plating layer covering the outer circumferential surface of the intermediate layer. The insulation layer includes polypropylene grains. The polypropylene grains have a crystal structure of monoclinic crystal, a crystal structure of hexagonal crystal, or a coexisting state of at least one of these crystal structures, and the polypropylene grains are oriented along two or less specific crystallographic axes. In the insulation layer, a degree of crystalline orientation $O_{110}$ calculated by an equation (2) is not greater than 0.65, $$O_{110} = \frac{I_{110}}{I_{110} + I_{040}} \qquad (2)$$

where $I_{110}$ denotes an integrated intensity of X-ray diffraction with an index 110, and $I_{040}$ denotes an integrated intensity of X-ray diffraction with an index 040.

The differential signal transmission cable according to (15) above can prevent or reduce a transmission loss of the differential signal transmission cable owing to increased adhesion of the electroless plating layer.

(16) A differential signal transmission cable according to another embodiment includes an insulation layer extending in a longitudinal direction of the differential signal transmission cable, a pair of signal lines extending in the longitudinal direction and buried inside the insulation layer, an intermediate layer covering an outer circumferential surface of the insulation layer, and a shield covering an outer circumferential surface of the intermediate layer. The shield includes an electroless plating layer covering the outer circumferential surface of the intermediate layer. The insulation layer includes polypropylene grains. The polypropylene grains have a crystallinity $X_c$ of not less than 0.3, the crystallinity $X_c$ being calculated by the equation (1) above.

The differential signal transmission cable according to (16) above can prevent or reduce a transmission loss of the differential signal transmission cable owing to increased adhesion of the electroless plating layer.

DETAILS OF EMBODIMENTS OF THE PRESENT DISCLOSURE

Next, embodiments will be described in detail with reference to the drawings. The same or corresponding parts have the same reference characters allotted in the figures, and redundant description will not be repeated.

Embodiment 1

Figure 2A:
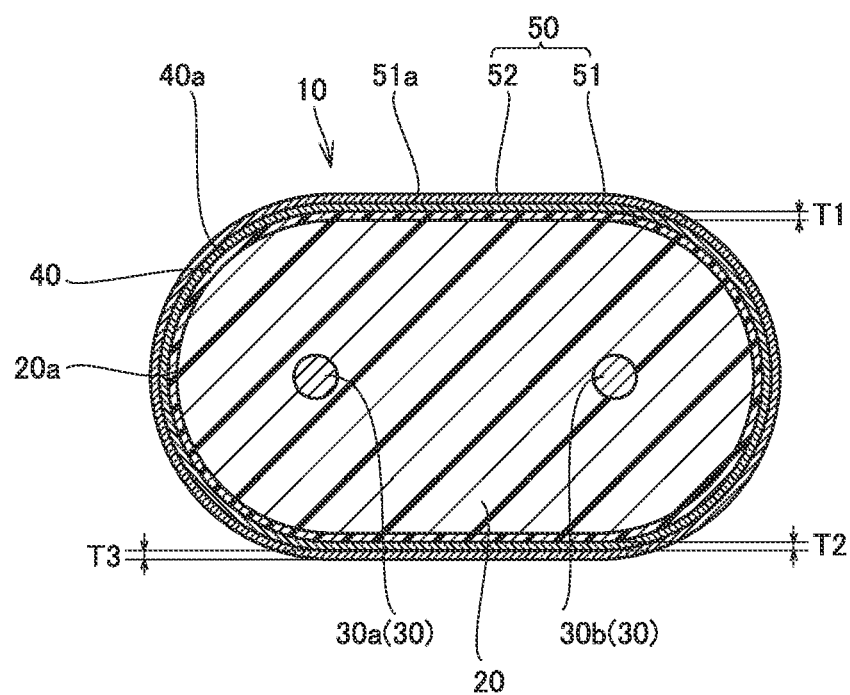
FIG. 2A is a sectional view of differential signal transmission cable 10.
Figure 2B:
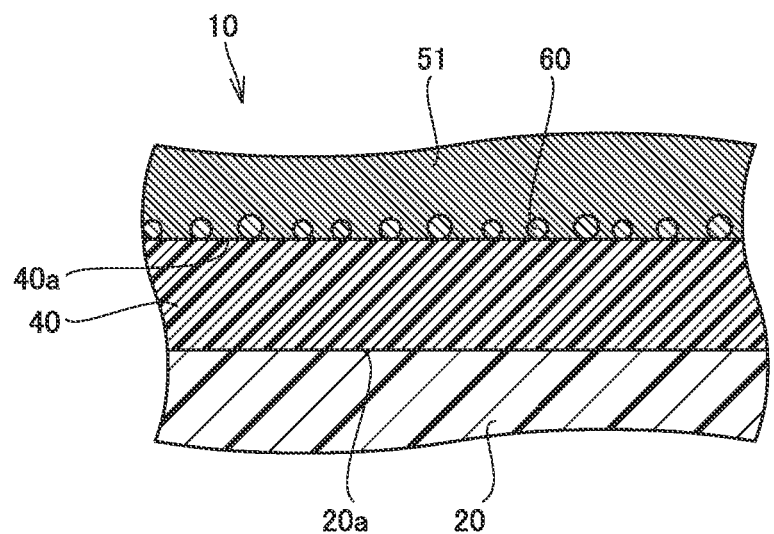
FIG. 2B is an enlarged view of FIG. 2A, which shows an interface between an intermediate layer 40 and an electroless plating layer 51 and therearound.

A differential signal transmission cable according to Embodiment 1 (referred to as "differential signal transmission cable 10" below) will be described below.
<Configuration of Differential Signal Transmission Cable 10>
FIG. 1 is a perspective view of differential signal transmission cable 10. FIG. 2A is a sectional view of differential signal transmission cable 10. FIG. 2B is an enlarged view of FIG. 2A, which shows an interface between an intermediate layer 40 and an electroless plating layer 51 and therearound. As shown in FIGS. 1, 2A, and 2B, differential signal transmission cable 10 includes an insulation layer 20, a signal line 30, intermediate layer 40, a shield 50, and catalyst particles 60.

Insulation layer 20 extends in a longitudinal direction of differential signal transmission cable 10. Insulation layer 20 is made of an insulating material.

Insulation layer 20 is made of, for example, polyethylene. However, insulation layer 20 may be made of a material other than polyethylene. Insulation layer 20 may be made of, for example, polyolefin. The melting point of polyolefin is preferably not less than 140° C., and more preferably, not less than 150° C., in terms of heat resistance properties.

Insulation layer 20 has an outer circumferential surface 20a. The arithmetic average roughness on outer circumferential surface 20a is preferably not greater than 2 μm. More preferably, the arithmetic average roughness on outer circumferential surface 20a is less than 0.6 μm. The arithmetic average roughness on outer circumferential surface 20a is measured under a laser microscope VM-X150 (available from KEYENE CORPORATION). More specifically, outer circumferential surface 20a is observed with a 50X objective lens, and analysis software VK-H1XM is applied to the observations, thus calculating an arithmetic average roughness in the longitudinal direction of the differential signal transmission cable.

A pair of signal lines 30 are provided (the respective signals lines 30 of the pair will be referred to as "signal line 30a" and "signal line 30b" below). A signal opposite in phase to a signal applied to signal line 30a is applied to signal line 30b. Consequently, a differential signal is transmitted through differential signal transmission cable 10.

Signal line 30a and signal line 30b are buried inside insulation layer 20. Signal line 30a and signal line 30b extend in the longitudinal direction of differential signal transmission cable 10. Signal line 30a and signal line 30b are made of a conductive material. Signal line 30a and signal line 30b are made of, for example, copper (Cu). However, signal line 30a and signal line 30b may be made of a material other than copper.

Intermediate layer 40 is formed to cover outer circumferential surface 20a. Intermediate layer 40 has a thickness T1. Thickness T1 is, for example, not greater than 1.5 μm. Thickness T1 is preferably not greater than 1 μm. Intermediate layer 40 has an outer circumferential surface 40a. Intermediate layer 40 is made of an insulating material. Intermediate layer 40 is made of, for example, polyolefin. However, intermediate layer 40 may be made of a material other than polyolefin.

Shield 50 is formed to cover outer circumferential surface 40a. Shield 50 is conductive. Shield 50 includes an electroless plating layer 51. Electroless plating layer 51 is a plating layer formed by electroless plating.

Electroless plating layer 51 is formed to cover outer circumferential surface 40a. Electroless plating layer 51 has a thickness T2. Thickness T2 is, for example, not less than 0.05 μm. Thickness T2 is, for example, not greater than 0.5 μm. Thickness T2 is preferably not less than 0.05 μm and not greater than 0.5 μm. Electroless plating layer 51 is, for example, an electroless copper plating layer. Electroless plating layer 51 has an outer circumferential surface 51a.

An electrical resistance value of electroless plating layer 51 is preferably less than 50 mΩ/cm. A defect rate of electroless plating layer 51 is preferably less than 1.5. The defect rate of electroless plating layer 51 is a value obtained by dividing an actual measurement of the electrical resistance value of electroless plating layer 51 by a theoretical value of the electrical resistance value of electroless plating layer 51.

The bonding strength between intermediate layer 40 and electroless plating layer 51 is, for example, not less than 0.1 N/cm. The bonding strength between intermediate layer 40 and electroless plating layer 51 is, for example, not greater than 6 N/cm. The bonding strength between intermediate layer 40 and electroless plating layer 51 is preferably not less than 0.3 N/cm and not greater than 6 N/cm. The bonding strength between intermediate layer 40 and electroless plating layer 51 is measured in a tensile test.

Shield 50 may further include an electroplating layer 52. Electroplating layer 52 is a plating layer formed by electroplating. Electroplating layer 52 is formed to cover outer circumferential surface 51a. Electroplating layer 52 has a thickness T3. The sum of thickness T2 and thickness T3 is preferably not greater than 6 μm. Electroplating layer 52 is, for example, a copper electroplating layer.

When electroplating layer 52 is a copper electroplating layer, electroplating layer 52 includes a plurality of copper grains. The average grain size of copper grains of electroplating layer 52 is, for example, not less than 0.5 μm. The average grain size of copper grains of electroplating layer 52 is an average obtained by observing a cross-section of electroplating layer 52 under a scanning electron microscope (SEM) and measuring the thicknesses of five points of electroplating layer 52 in a prescribed measurement visual field (e.g., 30 μm×20 μm).

Catalyst particles 60 are dispersed between electroless plating layer 51 and intermediate layer 40 (at an interface between electroless plating layer 51 and intermediate layer 40). In other words, catalyst particles 60 are not in the form of layer between electroless plating layer 51 and intermediate layer 40. When the area of the region of outer circumferential surface 40a in which catalyst particles 60 are not placed is not less than 90% of the area of the entire outer circumferential surface 40a, "catalyst particles 60 are dispersed between electroless plating layer 51 and intermediate layer 40". The average distance between catalyst particles 60 is preferably not less than 50 nm.

The average grain size of catalyst particles 60 is, for example, not greater than 300 nm. The average grain size of catalyst particles 60 is measured under a transmission electron microscope (TEM). Catalyst particles 60 contain, for example, palladium (Pd). However, catalyst particles 60 may contain a material other than palladium. Catalyst particles 60 may contain, for example, copper, silver (Ag), gold (Au), or the like.

The amount of catalyst particles 60 contained in differential signal transmission cable 10 is, for example, not less than 0.1 µg per centimeter in the longitudinal direction of differential signal transmission cable 10. The amount of catalyst particles 60 contained in differential signal transmission cable 10 is, for example, not greater than 10 µg per centimeter in the longitudinal direction of differential signal transmission cable 10. The amount of catalyst particles 60 contained in differential signal transmission cable 10 is preferably not less than 0.1 µg and not greater than 10 µg per centimeter in the longitudinal direction of differential signal transmission cable 10.

The amount of catalyst particles 60 contained per centimeter in the longitudinal direction of differential signal transmission cable 10 is measured with an inductively coupled plasma mass spectrometer. According to the finding of the inventors of the present invention, when the amount of catalyst particles 60 contained per centimeter in the longitudinal direction of differential signal transmission cable 10 is not less than 0.1 µg and not greater than 10 µg, catalyst particles 60 are not in the form of layer between electroless plating layer 51 and intermediate layer 40 and are dispersed between electroless plating layer 51 and intermediate layer 40.

<Method of Manufacturing Differential Signal Transmission Cable 10>

Figure 3:
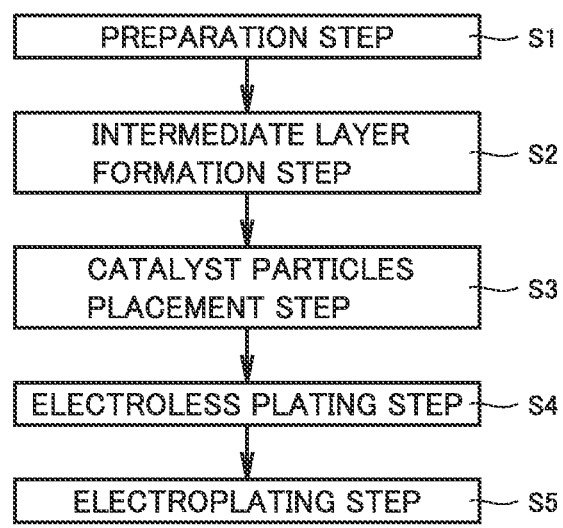
FIG. 3 is a process diagram showing a method of manufacturing differential signal transmission cable 10.

FIG. 3 is a process diagram showing a method of manufacturing differential signal transmission cable 10. As shown in FIG. 3, the method of manufacturing differential signal transmission cable 10 includes a preparation step S1, an intermediate layer formation step S2, a catalyst particles placement step S3, an electroless plating step S4, and an electroplating step S5.

Intermediate layer formation step S2 is performed after preparation step S1. Catalyst particles placement step S3 is performed after intermediate layer formation step S2. Electroless plating step S4 is performed after catalyst particles placement step S3. Electroplating step S5 is performed after electroless plating step S4.

Figure 4:
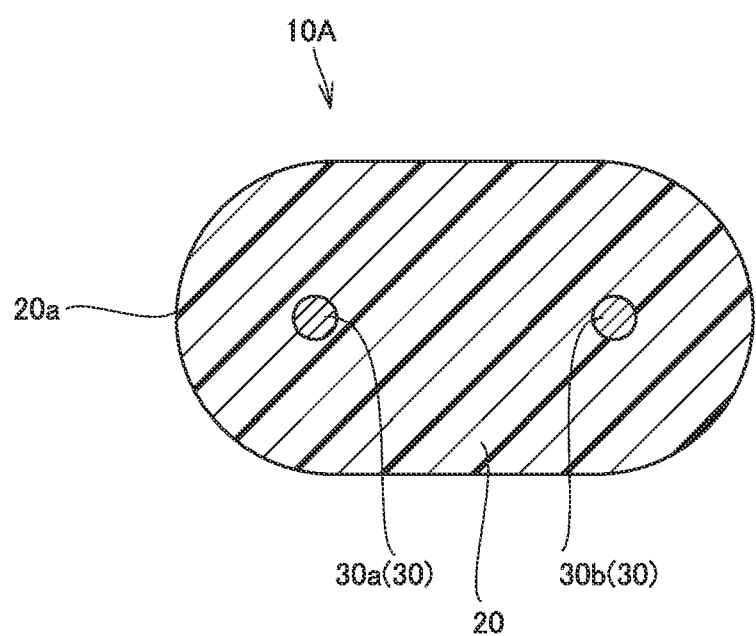
FIG. 4 is a sectional view of a workpiece 10A prepared in a preparation step S1.

In preparation step S1, a workpiece 10A is prepared. FIG. 4 is a sectional view of workpiece 10A prepared in preparation step S1. As shown in FIG. 4, workpiece 10A includes insulation layer 20 and signal line 30. In workpiece 10A, intermediate layer 40, shield 50, and catalyst particles 60 are yet to be formed.

Figure 5:
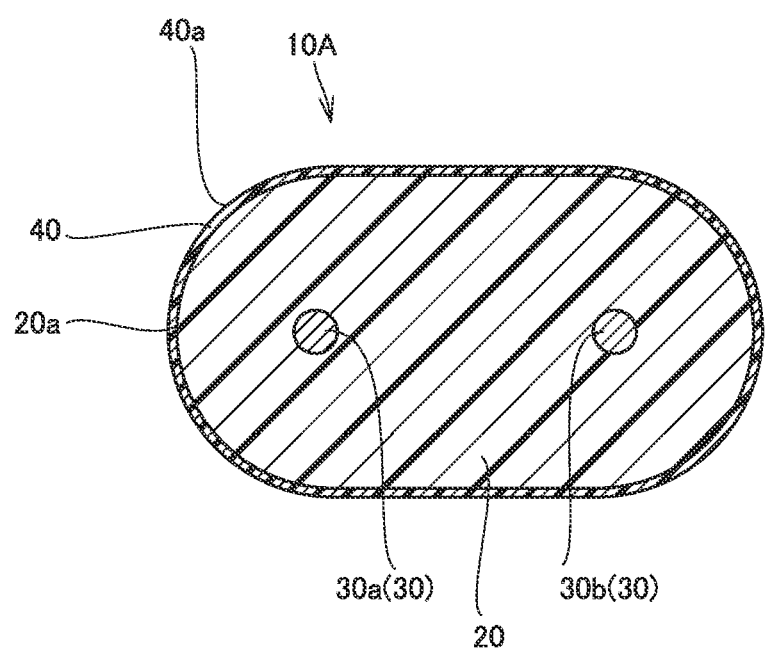
FIG. 5 is a sectional view of workpiece 10A after an intermediate layer formation step S2.

FIG. 5 is a sectional view of workpiece 10A after intermediate layer formation step S2. As shown in FIG. 5, in intermediate layer formation step S2, intermediate layer 40 is formed to cover outer circumferential surface 20a. In intermediate layer formation step S2, a material that forms intermediate layer 40 is applied to outer circumferential surface 20a, and the applied material is cured, thereby forming intermediate layer 40 so as to cover outer circumferential surface 20a.

Figure 6:
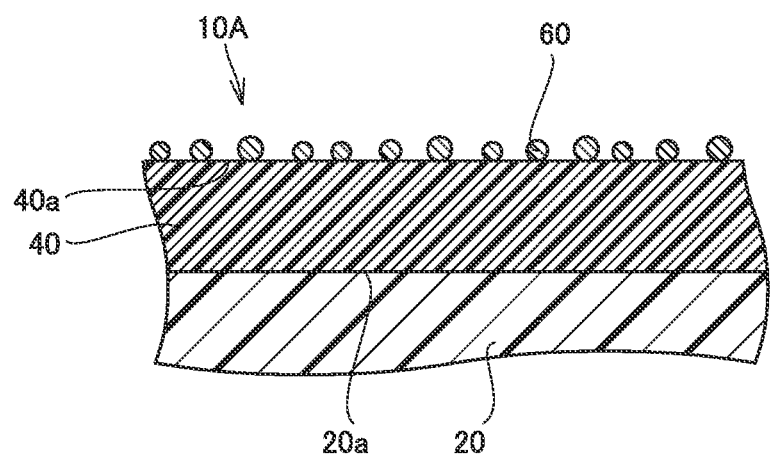
FIG. 6 is a sectional view of workpiece 10A after a catalyst particles placement step S3.

FIG. 6 is a sectional view of workpiece 10A after catalyst particles placement step S3. As shown in FIG. 6, in catalyst particles placement step S3, catalyst particles 60 are placed dispersively on outer circumferential surface 40a. In catalyst particles placement step S3, a solution containing catalyst particles 60 is applied to outer circumferential surface 40a, and the solution is volatilized, so that catalyst particles 60 are placed dispersively on outer circumferential surface 40a.

Figure 7:
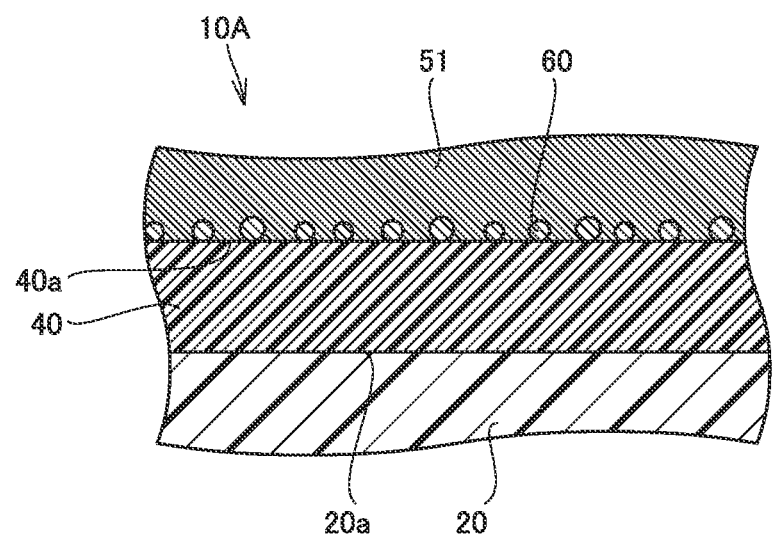
FIG. 7 is a sectional view of workpiece 10A after an electroless plating step S4.

FIG. 7 is a sectional view of workpiece 10A after electroless plating step S4. As shown in FIG. 7, in electroless plating step S4, electroless plating layer 51 is formed to cover outer circumferential surface 40a. In electroless plating step S4, workpiece 10A is immersed in a plating solution in which the material contained in electroless plating layer 51 is dissolved. Consequently, the material of electroless plating layer 51 is deposited to cover outer circumferential surface 40a with catalyst particles 60 present dispersively on outer circumferential surface 40a as a catalyst, thereby forming electroless plating layer 51.

In electroplating step S5, electroplating layer 52 is formed to cover outer circumferential surface 51a. In electroplating step S5, workpiece 10A is immersed in a plating solution in which the material contained in electroplating layer 52 is dissolved, and electroless plating layer 51 is made conductive. Consequently, the material of electroplating layer 52 is deposited on outer circumferential surface 51a, and differential signal transmission cable 10 having the structure shown in FIGS. 2A and 2B is manufactured.

<Effects of Differential Signal Transmission Cable 10>

In differential signal transmission cable 10, catalyst particles 60 are placed dispersively between intermediate layer 40 and electroless plating layer 51. Thus, minute asperities resulting from catalyst particles 60 are present in outer circumferential surface 40a. The minute asperities bring about the anchor effect in adhesion between electroless plating layer 51 and intermediate layer 40 formed to cover outer circumferential surface 40a, thereby achieving the adhesion of electroless plating layer 51.

As described above, the adhesion of electroless plating layer 51 is achieved by dispersively placing catalyst particles 60 between intermediate layer 40 and electroless plating layer 51, thus eliminating the need for roughening outer circumferential surface 20a. In differential signal transmission cable 10, accordingly, the attenuation characteristics deteriorate less easily in the high-frequency region due to roughening of outer circumferential surface 20a. In this manner, differential signal transmission cable 10 can achieve the adhesion of electroless plating layer 51 while preventing or reducing deterioration of attenuation characteristics in the high-frequency region.

In differential signal transmission cable 10, when the amount of catalyst particles 60 contained per centimeter in the longitudinal direction of differential signal transmission cable 10 is less than 0.1 µg, there may be a location on outer circumferential surface 40a which is not bonded to electroless plating layer 51.

In contrast, when the amount of catalyst particles 60 contained per centimeter in the longitudinal direction of differential signal transmission cable 10 is greater than 10 µg in differential signal transmission cable 10, asperities resulting from catalyst particles 60 present on outer circumferential surface 20a may become excessively large, deteriorating the attenuation characteristics in the high-frequency region. Accordingly, the adhesion of electroless plating layer 51 can be achieved while preventing or reducing deterioration of attenuation characteristics in the high-frequency region by setting the amount of catalyst particles 60 contained per centimeter in the longitudinal direction of differential signal transmission cable 10 to not less than 0.1 µg and not greater than 10 µg.

When the arithmetic average roughness on outer circumferential surface 20a is not greater than 2.0 µm (in particular, less than 0.6 µm), the deterioration of attenuation characteristics in the high-frequency region can be prevented or reduced further.

Differential signal transmission cables 10 may be stranded into a stranded wire. When the bonding strength between intermediate layer 40 and electroless plating layer 51 is less than 0.1 N/cm, electroless plating layer 51 may peel off when differential signal transmission cables 10 are stranded into a stranded wire.

When differential signal transmission cable 10 is connected to a connector or the like, a terminal treatment of peeling off shield 50 is performed. When the bonding strength between intermediate layer 40 and electroless plating layer 51 is greater than 6 N/cm, in this terminal treatment, shield 50 may not peel off at the interface between electroless plating layer 51 and intermediate layer 40, and a part of insulation layer 20 may peel off together with intermediate layer 40 in peeling-off of shield 50.

Thus, peeling-off of insulation layer 20 together with intermediate layer 40 can be prevented or reduced when the terminal treatment of differential signal transmission cable 10 is performed while preventing or reducing peeling-off of electroless plating layer 51 when differential signal transmission cables 10 are stranded into a stranded wire by setting the bonding strength between intermediate layer 40 and insulation layer 20 to not less than 0.1 N/cm and not greater than 6 N/cm.

When thickness T1 is not greater than 1 μm, the deterioration of attenuation characteristics in the high-frequency region can be prevented or reduced, which results from an impedance mismatch between insulation layer 20 and electroless plating layer 51, and intermediate layer 40. When the sum of thickness T2 and thickness T3 is not greater than 6 μm, a manufacturing cost associated with the formation of shield 50 can be reduced.

When shield 50 further includes electroplating layer 52, the electrical resistance value of the shield can be reduced. When the average grain size of copper grains of electroplating layer 52 is not less than 1 μm, the occurrence of a crack in electroplating layer 52 can be prevented or reduced when the differential signal transmission cable is bent (e.g., when the differential signal transmission cable undergoes bending deformation with a bending radius of approximately 300 mm), because electroplating layer 52 is relatively soft.

EXAMPLES

Description will be given of comparison test results of a differential signal transmission cable according to a comparative example (referred to as "differential signal transmission cable 70" below) and differential signal transmission cable 10. Differential signal transmission cable 70 includes insulation layer 20, signal line 30, intermediate layer 40, shield 50 including electroless plating layer 51 and electroplating layer 52, and catalyst particles 60. In this respect, the configuration of differential signal transmission cable 70 is similar to the configuration of differential signal transmission cable 10.

Figure 8:
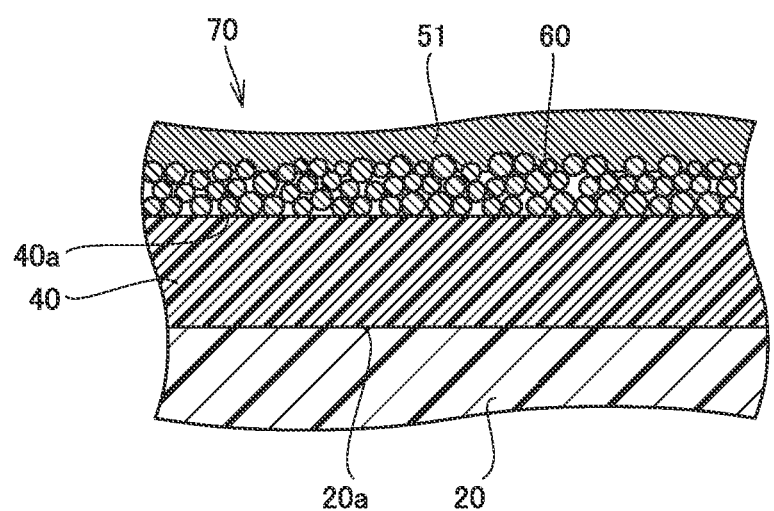
FIG. 8 is an enlarged sectional view of an interface between an intermediate layer 40 and an electroless plating layer 51 of a differential signal transmission cable 70 and therearound.

FIG. 8 is an enlarged sectional view of an interface between intermediate layer 40 and electroless plating layer 51 of differential signal transmission cable 70 and therearound. As shown in FIG. 8, catalyst particles 60 are placed in the form of layer between intermediate layer 40 and electroless plating layer 51 in differential signal transmission cable 70. In differential signal transmission cable 70, the layer of catalyst particles 60 has a porous structure including vacant spaces. In these respects, the configuration of differential signal transmission cable 70 is different from the configuration of differential signal transmission cable 10.

Figure 9A:
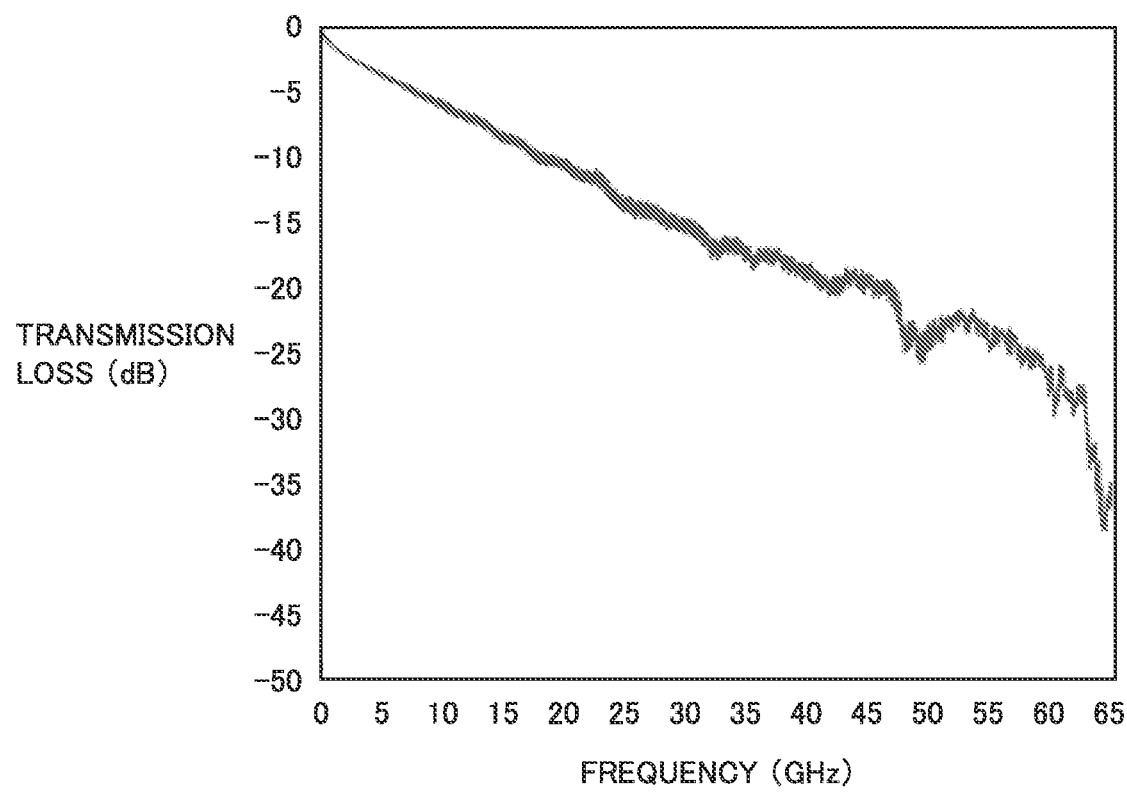
FIG. 9A is a graph showing attenuation characteristics of differential signal transmission cable 70.
Figure 9B:
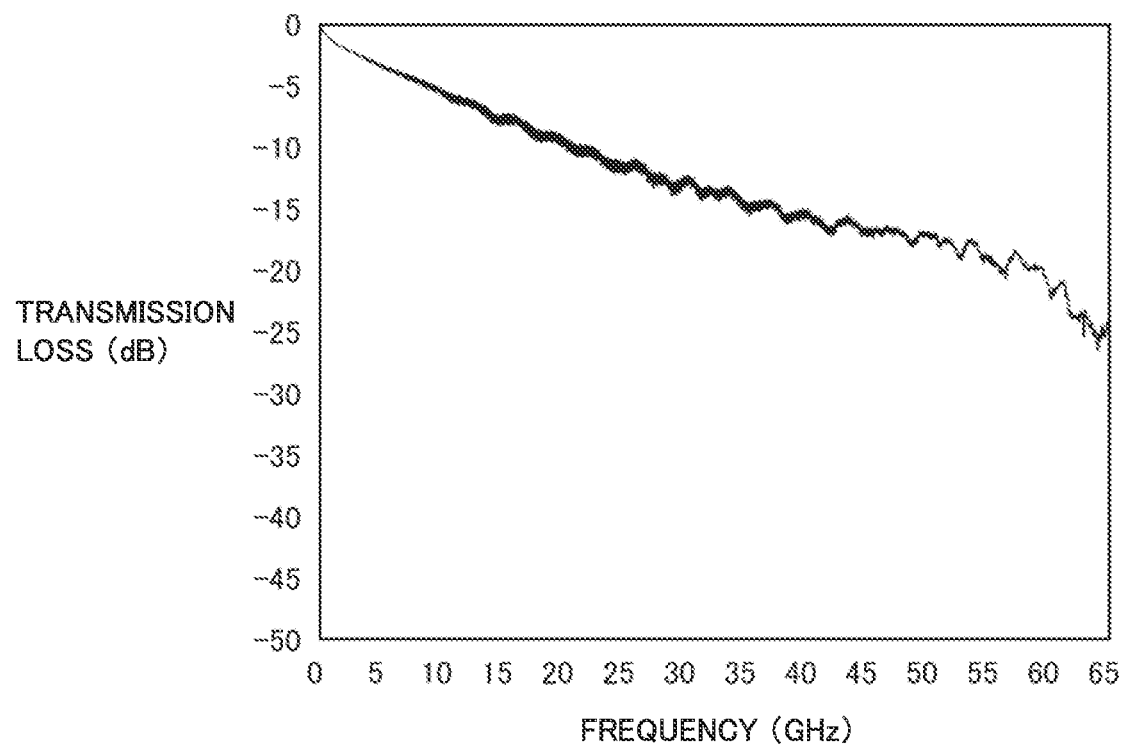
FIG. 9B is a graph showing attenuation characteristics of differential signal transmission cable 10.

FIG. 9A is a graph showing attenuation characteristics of differential signal transmission cable 70. FIG. 9B is a graph showing attenuation characteristics of differential signal transmission cable 10. In FIGS. 9A and 9B, the horizontal axis denotes a frequency (unit: GHz) of a signal applied to signal line 30, and the vertical axis denotes a transmission loss (unit: dB) obtained by evaluating with Sdd21 (differential insertion loss). In the graphs shown in FIGS. 9A and 9B, thickness T2 and the defect rate of electroless plating layer 51 were 5 μm and 1.1, respectively.

As shown in FIG. 9A, in differential signal transmission cable 70, a frequency range with a locally increasing transmission loss was present due to the vacant spaces inside catalyst particles 60 around 50 GHz. In contrast, as shown in FIG. 9B, a frequency range with a locally increasing transmission loss was not present (suck-out did not occur) in a frequency region up to at least 60 GHz in differential signal transmission cable 10. As described above, it has been experimentally indicated that deterioration of the attenuation characteristics in the high-frequency region can be prevented or reduced by dispersively placing catalyst particles 60 between intermediate layer 40 and electroless plating layer 51.

In differential signal transmission cable 70 with catalyst particles 60 placed in the form of layer between intermediate layer 40 and electroless plating layer 51, the bonding strength between electroless plating layer 51 and intermediate layer 40 may become excessively high, which peels off a part of insulation layer 20 together with intermediate layer 40 when shield 50 (electroless plating layer 51) is peeled off in the terminal treatment.

Embodiment 2

A differential signal transmission cable according to Embodiment 2 (referred to as "differential signal transmission cable 80" below) will be described below. A difference from differential signal transmission cable 10 will be mainly described, and redundant description will not be repeated.

<Configuration of Differential Signal Transmission Cable 80>

Figure 10:
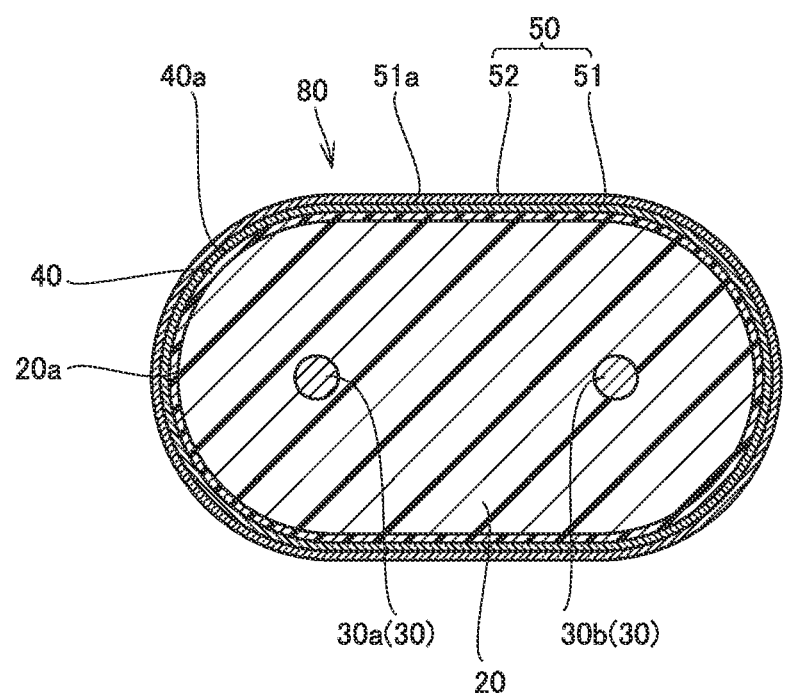
FIG. 10 is a sectional view of a differential signal transmission cable 80.

FIG. 10 is a sectional view of differential signal transmission cable 80. As shown in FIG. 10, differential signal transmission cable 80 includes insulation layer 20, signal line 30, intermediate layer 40, shield 50, and catalyst particles 60 (not shown in FIG. 10). Differential signal transmission cable 80 may include no catalyst particles 60.

In differential signal transmission cable 80, shield 50 includes electroless plating layer 51 and electroplating layer 52. In differential signal transmission cable 80, catalyst particles 60 are dispersed between intermediate layer 40 and electroless plating layer 51. In these respects, the configuration of differential signal transmission cable 80 is similar to the configuration of differential signal transmission cable 10. However, the configuration of differential signal transmission cable 80 is different from the configuration of differential signal transmission cable 10 in that insulation layer 20 is made of polypropylene.

Insulation layer 20 includes crystal grains of polypropylene (referred to as "polypropylene grains" below). Insulation layer 20 may include an amorphous phase of polypropylene. A crystallinity $X_c$ of polypropylene of insulation layer 20 is not less than 0.3. Crystallinity $X_c$ is calculated by the equation (1) above.

The polypropylene grains of insulation layer 20 have a crystal structure of monoclinic crystal, a crystal structure of hexagonal crystal, or a coexisting state of at least one of these crystal structures. The polypropylene grains of insulation layer 20 are oriented along two or less specific crystallographic axes. A degree of crystalline orientation $O_{110}$ of polypropylene grains of insulation layer 20 is not greater than 0.65. The degree of crystalline orientation of polypropylene grains of insulation layer 20 is calculated by the equation (2) above.

<Variations>

Although insulation layer 20 is made of polypropylene in the above description, insulation layer 20 may be made of a material other than polypropylene. More specifically, insulation layer 20 may be made of cyclic olefin polymer or polymethylpentene.

<Effects of Differential Signal Transmission Cable 80>

In differential signal transmission cable 80, the adhesion between insulation layer 20 and intermediate layer 40 and the adhesion between intermediate layer 40 and catalyst particles 60 can be improved, and accordingly, the adhesion of electroless plating layer 51 can increase, thus preventing or reducing a transmission loss of a differential signal transmission cable. When crystallinity $X_c$ is not less than 0.3, the adhesion between insulation layer 20 and intermediate layer 40 and the adhesion between intermediate layer 40 and catalyst particles 60 can be improved further, and accordingly, the adhesion of electroless plating layer 51 can increase further, thus further preventing or reducing a transmission loss of the differential signal transmission cable.

It should be construed that the embodiments disclosed herein have been presented for the purpose of illustration and non-restrictive in every respect. It is intended that the scope of the present invention is not limited to the above embodiments and examples but defined by the scope of the claims and encompasses all modifications equivalent in meaning and scope to the claims.

REFERENCE SIGNS LIST

10, 70, 80 differential signal transmission cable; 10A workpiece; 20 insulation layer; 20a outer circumferential surface; 30, 30a, 30b signal line; 40 intermediate layer; 40a outer circumferential surface; 50 shield; 51 electroless plating layer; 51a outer circumferential surface; 52 electroplating layer; 60 catalyst particles; S1 preparation step; S2 intermediate layer formation step; S3 catalyst particles placement step; S4 electroless plating step; S5 electroplating step; T1, T2, T3 thickness.

The invention claimed is:

1. A differential signal transmission cable comprising:
an insulation layer extending in a longitudinal direction of the differential signal transmission cable;
a pair of signal lines extending in the longitudinal direction and buried inside the insulation layer;
an intermediate layer covering an outer circumferential surface of the insulation layer;
a shield covering an outer circumferential surface of the intermediate layer; and
catalyst particles,
wherein
the shield includes an electroless plating layer covering the outer circumferential surface of the intermediate layer, and
the catalyst particles are dispersed between the intermediate layer and the electroless plating layer such that the catalyst particles are not in the form of a layer, and an area of the outer circumferential surface of the intermediate layer in which catalyst particles are not placed is not less than 90% of the area of the entire outer circumferential surface of the intermediate layer.

2. The differential signal transmission cable according to claim 1, wherein an amount of the catalyst particles contained in the differential signal transmission cable is not less than 0.1 μg and not greater than 10 μg per centimeter in the longitudinal direction.

3. The differential signal transmission cable according to claim 1, wherein an arithmetic average roughness on the outer circumferential surface of the insulation layer is not greater than 2.0 μm.

4. The differential signal transmission cable according to claim 1, wherein an arithmetic average roughness on the outer circumferential surface of the insulation layer is less than 0.6 μm.

5. The differential signal transmission cable according to claim 1, wherein a bonding strength between the intermediate layer and the electroless plating layer is not less than 0.1 N/cm and not greater than 6 N/cm.

6. The differential signal transmission cable according to claim 1, wherein a thickness of the electroless plating layer is not less than 0.05 μm and not greater than 0.5 μm.

7. The differential signal transmission cable according to claim 1, wherein the shield further includes an electroplating layer covering an outer circumferential surface of the electroless plating layer.

8. The differential signal transmission cable according to claim 7, wherein
the electroplating layer is a copper electroplating layer, and
an average grain size of copper grains of the electroplating layer is not less than 0.5 μm.

9. The differential signal transmission cable according to claim 7, wherein a sum of a thickness of the electroless plating layer and a thickness of the electroplating layer is not greater than 6 μm.

10. The differential signal transmission cable according to claim 1, wherein the catalyst particles contain palladium.

11. The differential signal transmission cable according to claim 1, wherein the insulation layer includes polyolefin having a melting point of not less than 140° C.

12. The differential signal transmission cable according to claim 1, wherein the insulation layer includes at least any of polypropylene, cyclic olefin polymer, and polymethylpentene.

13. The differential signal transmission cable according to claim 1, wherein
the insulation layer includes polypropylene grains, and
the polypropylene grains have a crystallinity $X_c$ of not less than 0.3, the crystallinity $X_c$ being calculated by an equation (1), $$X_c = \frac{I_c}{I_c + I_a} \quad (1)$$

where $I_c$ denotes an X-ray diffraction intensity of a crystalline component, and $I_a$ denotes an X-ray diffraction intensity of a non-crystalline component.

14. The differential signal transmission cable according to claim 1, wherein
the insulation layer includes polypropylene grains,
the polypropylene grains have a crystal structure of monoclinic crystal, a crystal structure of hexagonal crystal, or a coexisting state of at least one of these crystal structures, and the polypropylene grains are oriented along two or less specific crystallographic axes, and in the insulation layer, a degree of crystalline orientation $O_{110}$ calculated by an equation (2) is not greater than 0.65, $$O_{110} = \frac{I_{110}}{I_{110} + I_{040}} \qquad (2)$$

where $I_{110}$ denotes an integrated intensity of X-ray diffraction with an index 110, and $I_{040}$ denotes an integrated intensity of X-ray diffraction with an index 040.

15. A differential signal transmission cable comprising:

an insulation layer extending in a longitudinal direction of the differential signal transmission cable;

a pair of signal lines extending in the longitudinal direction and buried inside the insulation layer;

an intermediate layer covering an outer circumferential surface of the insulation layer;

a shield covering an outer circumferential surface of the intermediate layer; and catalyst particles, wherein the shield includes an electroless plating layer covering the outer circumferential surface of the intermediate layer, the catalyst particles are dispersed between the intermediate layer and the electroless plating layer such that the catalyst particles are not in the form of a layer, and an area of the outer circumferential surface of the intermediate layer in which catalyst particles are not placed is not less than 90% of the area of the entire outer circumferential surface of the intermediate layer, and a thickness of the intermediate layer is not greater than 1 µm.

* * * * *